(12) United States Patent
Sun et al.

(10) Patent No.: US 8,216,703 B2
(45) Date of Patent: Jul. 10, 2012

(54) MAGNETIC TUNNEL JUNCTION DEVICE

(75) Inventors: Jijun Sun, Chandler, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 563 days.

(21) Appl. No.: 12/035,011

(22) Filed: Feb. 21, 2008

(65) Prior Publication Data

US 2009/0213503 A1 Aug. 27, 2009

(51) Int. Cl.
*G11B 5/39* (2006.01)

(52) U.S. Cl. ............... 428/811.1; 428/811.2; 428/811.5; 360/324.11; 360/324.12; 360/324.2

(58) Field of Classification Search .................. None
See application file for complete search history.

(56) References Cited

U.S. PATENT DOCUMENTS

| | | | |
|---|---|---|---|
| 6,784,509 B2 * | 8/2004 | Kamiguchi et al. | 257/421 |
| 6,870,711 B1 * | 3/2005 | Zhao et al. | 428/828 |
| 6,946,697 B2 | 9/2005 | Pietambaram et al. | |
| 7,141,314 B2 * | 11/2006 | Zhang et al. | 428/811.2 |
| 7,236,336 B2 * | 6/2007 | Gill | 360/324.12 |
| 8,059,374 B2 * | 11/2011 | Zhao et al. | 360/324.2 |
| 2002/0009616 A1 * | 1/2002 | Kamiguchi et al. | 428/692 |
| 2005/0174702 A1 * | 8/2005 | Gill | 360/324.2 |
| 2005/0225907 A1 * | 10/2005 | Hoshiya et al. | 360/324.12 |
| 2007/0047159 A1 * | 3/2007 | Zhao et al. | 360/324.12 |
| 2007/0070556 A1 * | 3/2007 | Zhang et al. | 360/324.11 |
| 2008/0239589 A1 * | 10/2008 | Guo et al. | 360/324.12 |
| 2009/0122450 A1 * | 5/2009 | Wang et al. | 360/324.2 |

\* cited by examiner

*Primary Examiner* — Kevin Bernatz
(74) *Attorney, Agent, or Firm* — Ingrassia Fisher & Lorenz, P.C.

(57) ABSTRACT

A magnetic tunnel junction (MTJ) (10) employing a dielectric tunneling barrier (16), useful in magnetoresistive random access memories (MRAMs) and other devices, has a synthetic antiferromagnet (SAF) structure (14, 16), comprising two ferromagnetic (FM) layers (26, 41; 51, 58; 61, 68) separated by a coupling layer (38, 56, 66). Improved magnetoresistance (MR) ratio is obtained by providing a further layer (44, 46, 46', 47, 52, 62), e.g. containing Ta, preferably spaced apart from the coupling layer (38, 56, 66) by a FM layer (41, 30-2, 54). The further layer (44, 46, 46', 47, 52, 62) may be a Ta dusting layer (44) covered by a FM layer (30-2), or a Ta containing FM alloyed layer (46), or a stack (46') of interleaved FM and N-FM layers, or other combination (47, 62). Furthering these benefits, another FM layer, e.g., CoFe, NiFe, (30, 30-1, 51, 61) is desirably provided between the further layer (44, 46, 46', 47, 52, 62) and the tunneling barrier (16). Ta, Zr, Hf, Ti, Mg, Nb, V, Zn, Cr, NiFeX, CoFeX and CoFeBX (X=Ta, Zr, Hf, Ti, Mg, Nb, V, Zn, Cr) are useful for the further layer (44, 46, 46', 47, 52, 62).

21 Claims, 3 Drawing Sheets

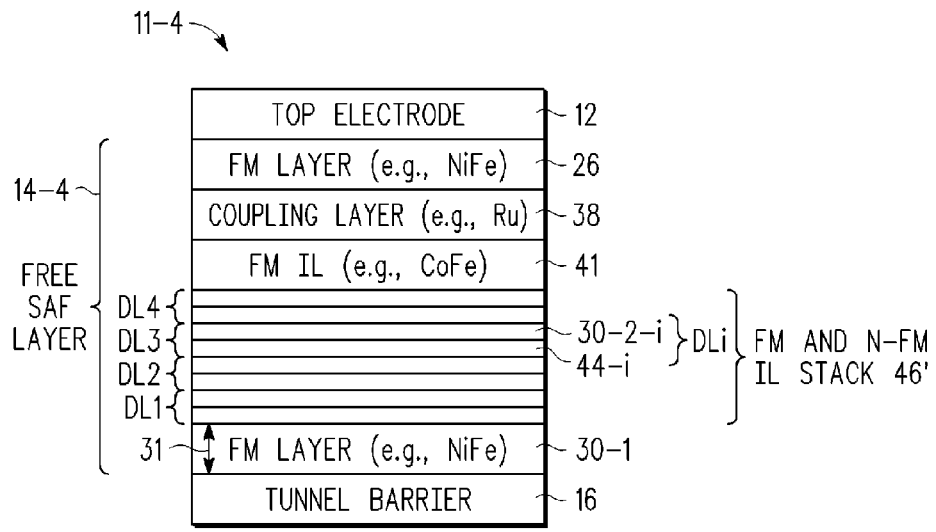
*FIG. 5*
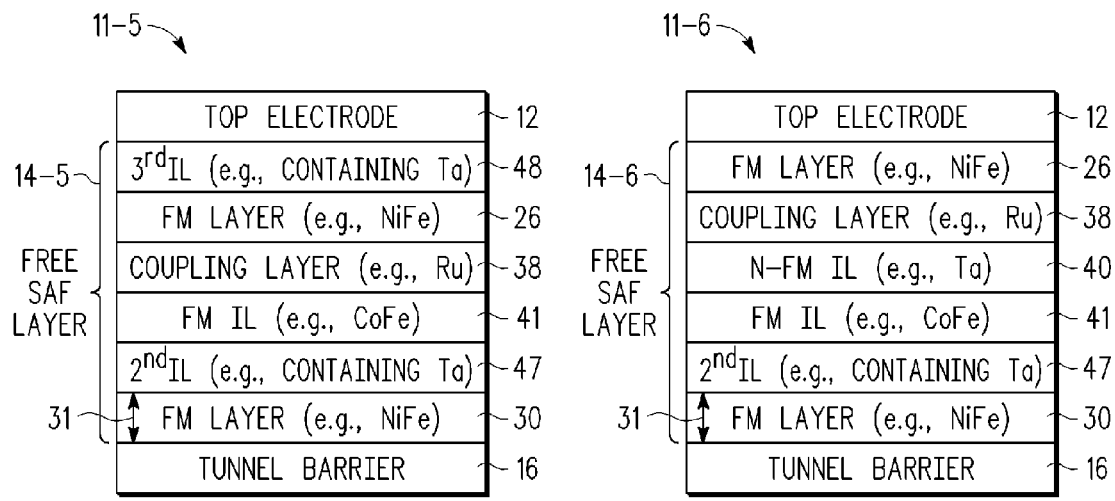
*FIG. 6*          *FIG. 7*

| | |
|---|---|
| TOP ELECTRODE | 12 |
| 3rd IL (e.g., CONTAINING Ta) | 48 |
| FM LAYER (e.g., NiFe) | 26 |
| COUPLING LAYER (e.g., Ru) | 38 |
| N-FM IL (e.g., Ta) | 40 |
| FM IL (e.g., CoFe) | 41 |
| 2nd IL (e.g., CONTAINING Ta) | 47 |
| FM LAYER (e.g., NiFe) | 30 |
| TUNNEL BARRIER | 16 |

14-7: FREE SAF LAYER
31

| | |
|---|---|
| TUNNEL BARRIER | 16 |
| FM LAYER (e.g., CoFeB) | 50 / 51 |
| N-FM IL (e.g., Ta) | 52 |
| FM IL (e.g., CoFeB) | 54 / 55 |
| COUPLING LAYER (e.g., Ru) | 56 |
| FM LAYER (e.g., CoFe) | 58 |
| PINNING LAYER (e.g., PtMn) | 20 |
| SEED LAYER | 22 |
| BASE ELECTRODE | 24 |

18-1: PINNED SAF LAYER

| | |
|---|---|
| TUNNEL BARRIER | 16 |
| FM LAYER (e.g., CoFe) | 60 / 61 |
| FM & N-FM IL (e.g., CoFeBTa) | 62 |
| COUPLING LAYER (e.g., Ru) | 66 |
| FM LAYER (e.g., CoFe) | 68 |
| PINNING LAYER | 20 |
| SEED LAYER | 22 |
| BASE ELECTRODE | 24 |

18-2: PINNED SAF LAYER

MAGNETIC TUNNEL JUNCTION DEVICE

TECHNICAL FIELD

This invention relates to magnetic tunnel junction (MTJ) devices, and more particularly to MTJ devices that incorporate synthetic antiferromagnet (SAF) structures.

BACKGROUND

Magnetoresistive random access memories (MRAMs) that employ magnetic tunnel junction (MTJ) devices are known to have many benefits such as being fast, non-volatile, and high density. It is known to use synthetic anti-ferromagnetic (SAF) structures in connection with these MTJ and MRAM structures, such as are described, for example, in commonly owned US. Pat. No. 6,946,697 "Synthetic Antiferromagnet Structures for use in MTJS in MRAM technology" by Pietambaram et al. One of the continuing desires with MRAM and other magneto-electronic technologies employing MTJs is to improve the magnetoresistance (MR) ratio, which is the ratio of the change in resistance between the high and low resistance states to that of the low resistance state. Since the signal available to the sense circuitry is proportional to the MR, an improvement that increases MR in an MTJ can result in an improvement in sensing speed, lower read error rate, and greater temperature stability. Thus, there is an ongoing need for MTJ and MRAM development to improve the MR ratio. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention is illustrated by way of example and not limited by the accompanying figures, in which like references indicate similar elements, and in which:

FIG. 5 is a cross section of a portion of the MTJ of FIG. 1 embodying the free SAF layer, according to a still further embodiment of the invention and showing additional detail;

FIG. 6 is a cross section of a portion of the MTJ of FIG. 1 embodying the free SAF layer, according to a yet further embodiment of the invention and showing additional detail;

FIG. 7 is a cross section of a portion of the MTJ of FIG. 1 embodying the free SAF layer, according to a yet still further embodiment of the invention and showing additional detail;

FIG. 8 is a cross section of a portion of the MTJ of FIG. 1 embodying the pinned or fixed SAF layer, according to a still yet further embodiment of the invention and showing additional detail;

FIG. 9 is a cross section of a portion of the MTJ of FIG. 1 embodying the pinned or fixed SAF layer, according to an additional embodiment of the invention and showing further detail; and FIG. 10 is a cross section of a portion of the MTJ of FIG. 1 embodying the pinned or fixed SAF layer, according to a yet additional embodiment of the invention and showing further detail.

DETAILED DESCRIPTION

Figures 1, 2:
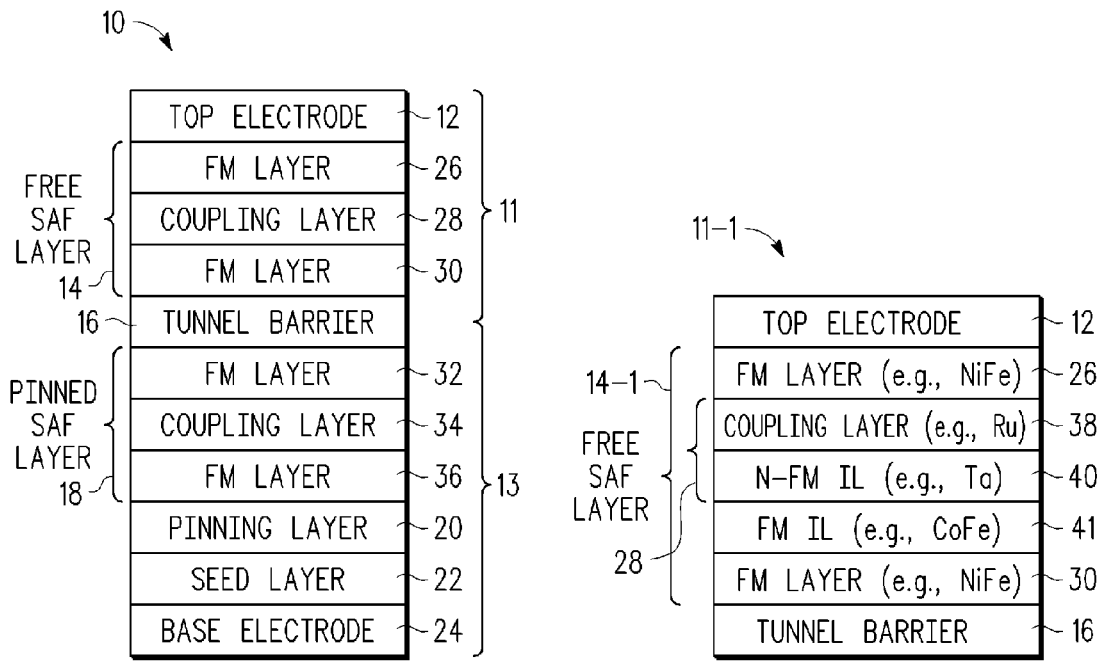
FIG. 1 is a cross section of a magnetic tunnel junction (MTJ) employing a free SAF layer and a pinned or fixed SAF layer for use in an MRAM according to an embodiment of the invention.
FIG. 2 is a cross section of a portion of the MTJ of FIG. 1 embodying the free SAF layer, according to the teachings of commonly owned U.S. Pat. No. 6,946,697.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. For simplicity and clarity of illustration, the drawing figures illustrate the general manner of construction and method of fabrication, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention. The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. It is to be understood that the embodiments of the invention described herein may be used, for example, in other orientations than those illustrated or otherwise described herein. The term "coupled," as used herein, is defined as directly or indirectly connected in an electrical or non-electrical manner.

Shown in FIG. 1 is MTJ 10 comprising top electrode 12, free SAF layer 14 immediately under top electrode 12, tunnel barrier 16 immediately under free SAF layer 14, fixed or pinned SAF layer 18 immediately under tunnel barrier 16, pinning layer 20 immediately under fixed SAF layer 18, seed layer 22 immediately under layer 20, and base electrode 24 immediately under seed layer 22. Free SAF layer 14 comprises ferromagnetic (abbreviated as "FM") layer 26 immediately under top electrode 12, coupling layer 28 immediately under ferromagnetic layer 26, and ferromagnetic layer 30 immediately under coupling layer 28. Fixed or pinned SAF layer 18 comprises ferromagnetic layer 32 immediately under tunnel barrier 16, coupling layer 34 immediately under ferromagnetic layer 32, and ferromagnetic layer 36 immediately under coupling layer 34. Ferromagnetic layers 32 and 36 are preferably comprised of alloys that include cobalt and iron. Except that SAF layers 14 and 18 of the present invention include certain ferromagnetic and non-ferromagnetic materials in various new arrangements, MTJ 10 without such modifications is known to one of ordinary skill in the art. It is also known to those skilled in the art that fixed or pinned SAF layer 18 can be replaced by other structures that provide a magnetically fixed or pinned FM layer in contact with the tunnel barrier 16, such as a single FM layer. As employed herein, the words "fixed" and "pinned" are used equivalently to refer to ferromagnetic layer(s) whose magnetic moment vector does not move substantially in the applied magnetic fields used to switch the magnetic moment vector of the free layer and the word "free" is intended to refer to ferromagnetic layers whose magnetic moment does move significantly in response to such applied magnetic fields. For convenience of description upper portion 11 of MTJ 10 refers to the combination of top electrode 12, free SAF layer 14 and tunnel barrier 16, and lower portion 13 of MTJ 10 refers to the combination of tunnel barrier 16, fixed or pinned SAF layer 18, pinning layer 20, seed layer 22 and base electrode 24. The convention is adopted of identifying various different embodiments of upper portion 11 comprising free SAF layer 14 by adding suffixes, as for example, 11-1, 11-2, 11-3, etc., with free SAF layers 14-1, 14-2, 14-3, etc., respectively, and identifying various different embodiments of lower portion 13 comprising fixed or pinned SAF layer 18 by adding suffixes, as for example, 13-1, 13-2, 13-3, etc., with pinned SAF layers 18-1, 18-2, 18-3, etc., respectively, with the understanding that any combination of the different embodiments 11-1, 11-2, 11-3, etc. and 13-1, 13-2, 13-3, etc., may be substituted for portions 11 and/or 13 of MTJ structure 10.

Because a large number of layers having various materials therein and complex interactions are shown in FIGS. 2-10 and described in the associated text, non-limiting examples of suitable materials for the various layers are included in the drawings figures. This is intended merely for convenience of explanation and to reduce the confusion that might be caused by the reader having to continually refer back and forth between the associated text and the drawing figures in order to keep in mind what kinds of materials are included in each layer for the different embodiments. Accordingly, such illustrations in the drawing figures are provided by way of example to facilitate explanation and are not intended to be limiting.

Shown in FIG. 2 is upper portion 11-1 of MTJ 10 according to the teachings of commonly owned U.S. Pat. No. 9,646,697, incorporating SAF layer 14-1 comprising ferromagnetic layers 26, coupling layer 28, FM insertion layer 41, and FM layer 30. Coupling layer 28 comprises coupling layer 38 immediately under ferromagnetic layer 26 and non-ferromagnetic (abbreviated as "N-FM") insertion layer 40 (e.g., of Ta) immediately under coupling layer 38. FM insertion layer 41 (e.g., of CoFe) is provided between ferromagnetic layer 30 and insertion layer 40. For convenience of illustration, the words "insertion layer" are abbreviated as "IL" in the various figures. FM insertion layer (IL) 41, having for example, ferromagnetic materials of iron (Fe) and cobalt (Co), functions magnetically as part of ferromagnetic layer 30. While insertion layer 41 is preferably a cobalt-iron (CoFe) alloy it may also be of other materials instead, such as cobalt (Co) or iron (Fe) or other alloys containing Co or Fe or CoFeX, where X represents a non-magnetic material, such as Ta, Zr, Hf or combinations thereof. Coupling layer 38 preferably comprises ruthenium (Ru) but can also comprise other coupling materials such as rhodium (Rh), rhenium (Re), iridium (Ir), and osmium (Os). As used herein, the words "coupling material" and "coupling layer", singular or plural, mean a material that can provide antiferromagnetic coupling between two nearby ferromagnetic materials in an SAF structure. Non-ferromagnetic (N-FM) insertion layer (IL) 40 is preferably tantalum (Ta) and is inserted to improve the properties of SAF layer 14. Insertion layer 41 is preferably cobalt-iron (CoFe) and is also inserted to improve the properties of SAF layer 14. Ferromagnetic layers 26 and 30 are preferably nickel-iron (NiFe) alloy with 16 to 20 atomic percent iron (Fe), and more preferably about 18 atomic percent iron. Coupling layer 38 is preferably 6.0 to 6.5 Angstroms in average thickness, insertion layer 40 is preferably deposited to an average thickness of about 2.5 Angstroms and FM insertion layer 41 usefully has an average thickness in the range of about 1.5-10 Angstroms, more conveniently an average thickness in the range of about 2-5 Angstroms, and preferably an average thickness of about 2.5 Angstroms. These dimensions are based on using ruthenium (Ru) as the coupling layer material having a coupling peak centered around 7-9 Angstroms. With insertion layers 40 and 41 being deposited in some cases to sub-atomic thicknesses, insertion layers 40 and 41 (or together with coupling layer 38) may appear as a single alloyed layer. Thus, it may be difficult to actually distinguish layers 40 and 41 as separate layers in a finished MTJ such as MTJ 10.

While the SAF structure of FIG. 2 provides improvement in the MR ratio and thermal stability, it has been found that modifications of this structure can provide further improvement. Increasing the thickness of Ta insertion layer 40 of FIG. 2 causes the MR ratio to increase. However, with thick Ta insertion layers to maximize the MR ratio, it is difficult or impossible to obtain sufficiently high antiferromagnetic coupling in SAF free layer 14-1. Antiferromagnetic coupling strength is normally determined by the saturation magnetic field (Hsat), where magnetizations of the two ferromagnetic layers separated by the coupling layer are aligned along the same direction as an external magnetic field. Hsat is one of the important parameters to control switching current in toggle MRAMs, and should be high enough (typically hundreds of Oersteds) for good switching characteristics. These problems can be ameliorated or avoided by using modified structures such as are illustrated in the embodiments of FIGS. 3-8 for free SAF layer 14 and in FIGS. 9-10 for fixed or pinned SAF layer 18.

By way of overview, FIGS. 3-8 illustrate various embodiments of the invention in which free SAF layer 14 is modified and FIGS. 9-10 illustrate various embodiments of the invention in which pinned SAF layer 18 is modified. In FIGS. 3-6, N-FM IL 40 (e.g., of Ta) of FIG. 2 is eliminated and a further N-FM layer (e.g., containing Ta) inserted below FM IL 41 which is in contact with coupling layer 38, wherein the further N-FM layer is implemented by: (i) N-FM (e.g. Ta) dusting layer 44 covered by FM layer 30-2 in FIG. 3, (ii) alloyed FM & N-FM layer 46 in FIG. 4, (iii) FM and N-FM insertion layer stack 46' formed from interleaved N-FM (e.g. of Ta) layers and FM layers 30-2-i in FIG. 5, and (iv) FM & N-FM $2^{nd}$ IL 47 (e.g., containing Ta) in FIG. 6, in combination with all or part of FM layer 30, 30-1, 30-2, etc. In FIGS. 7-8, N-FM IL 40 is retained and FM & N-FM $2^{nd}$ IL 47 (e.g., containing Ta) is inserted as in FIGS. 3-6. In FIGS. 6 and 8, further $3^{rd}$ N-FM IL 48 (e.g., containing Ta) is inserted just above FM layer 26. In FIGS. 9-10, analogous modifications are made to pinned SAF layer 18.

Figures 3, 4:
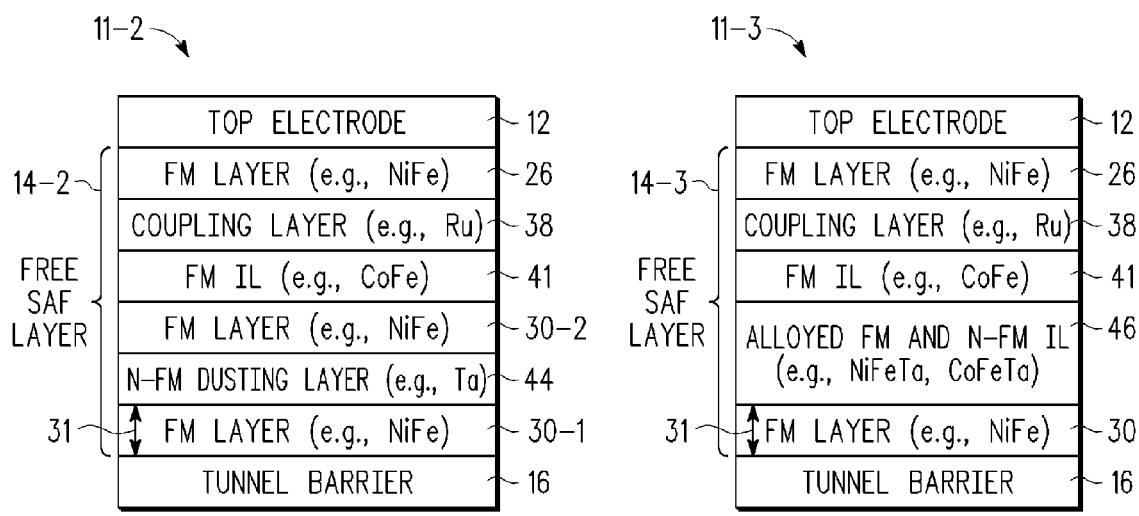
FIG. 3 is a cross section of a portion of the MTJ of FIG. 1 embodying the free SAF layer, according to an embodiment of the invention and showing additional detail.
FIG. 4 is a cross section of a portion of the MTJ of FIG. 1 embodying the free SAF layer, according to a further embodiment of the invention and showing additional detail.

FIG. 3 is a cross section of upper portion 11-2 of MTJ 10 of FIG. 1 embodying free SAF layer 14-2, according to an embodiment of the invention and showing additional detail. SAF layer 14-2 of FIG. 3 (and/or layers 14-3, 14-4, 14-5, 14-6, 14-7 of FIGS. 4-8) would be substituted for SAF layer 14 in the structure of FIG. 1. Top electrode 12 and tunnel barrier 16 in FIGS. 3-8 are the same as in FIG. 2. Free SAF layer 14-2 of FIG. 3 differs from free SAF layer 14-1 of FIG. 2, in that layer N-FM IL 40 is omitted and FM layer 30 of FIG. 2 is split into two portions, i.e. layers 30-1 and 30-2 with N-FM dusting layer (e.g., of Ta) 44 therebetween. Layer 44 is referred to as a "dusting" layer because, in some embodiments, it is so thin as to perhaps be discontinuous and resemble atoms or groups of atoms, such as for example of Ta or equivalent materials, "dusted" onto the surface of FM layer 30-1 and then covered by FM layer 30-2. FM layers 30-1 and 30-2 are preferably of NiFe alloy but other FM materials can also be used.

FIG. 4 is a cross section of upper portion 11-3 of the MTJ of FIG. 1 embodying free SAF layer 14-3, according to a further embodiment of the invention and showing additional detail. Free SAF layer 14-3 of FIG. 4 differs from free SAF layer 14-2 of FIG. 3 in that the combination of Ta dusting layer 44 and FM layer 30-2 is replaced by FM & N-FM alloy layer 46, formed for example by co-deposition of the FM material and the N-FM material (e.g. Ta). Examples of suitable alloys for layer 46 are NiFeTa and CoFeTa and combinations thereof with Ta atomic percent usefully in the range of about 2 to 25% Ta in the FM material, conveniently in the range of about 2 to 15% Ta in the FM material, and preferably about 4 to 10% Ta in the FM material. Other materials besides Ta may also be used in layers 44, 46, as for example, Zr, Hf, Ti, V, Mg, Nb, Zn, Cr, and combinations thereof. Ta, Hf and Ti are particularly desirable because they are the commonly used materials in semiconductor industry and tools and technology for forming them are readily available. While co-deposition is an example of a suitable technique for forming such FM & N-FM alloy layers, other techniques may also be used, as for example, sequential deposition plus annealing.

FIG. 5 is a cross section of portion 11-4 of the MTJ of FIG. 1 embodying free SAF layer 14-4, according to a still further embodiment of the invention and showing additional detail. In free SAF layer 14-4 of FIG. 5, alloyed FM & N-FM layer 46 of FIG. 4 is replaced by stack 46' of sequentially formed FM & N-FM double layers DLi, for example, DL1, plus DL2, plus DL3, etc., where "DL" stands for "double layer" and where each double layer (i.e., DLi for i=1, 2, 3, etc.) is comprised of N-FM layer 44-i of, for example, Ta or equivalent materials identified above in connection with FIGS. 3 and 4, with FM layer 30-2-i of, for example NiFe or CoFe or a combination thereof. It does not matter which layer 44-i or 30-2-i is deposited first. Individual N-FM layers 44-i are usefully about 0.1 to 2 Angstroms in average thickness, more conveniently about 0.2 to 1.5 Angstroms in average thickness and preferably about 0.3 to 1.0 Angstroms in average thickness. Individual FM layers 30-2-i are usefully about 2 to 20 Angstroms in average thickness, more conveniently about 3 to 15 Angstroms in average thickness and preferably about 5 to 10 Angstroms in average thickness. Stated another way, it is desirable that the average thickness of individual FM-layers 30-2-i is usefully about 5 to 50 times the average thickness of individual N-FM layers 44-i, more conveniently 10 to 30 times the average thickness and preferably about 15 to 25 times the average thickness of N-FM layers 44-i. As noted previously, Ta is useful for N-FM layers 44-i and CoFe and/or NiFe are useful for FM layers 30-2-i, but other non-ferromagnetic materials are also useful, as for example and not intended to be limiting, those noted above in connection with FIGS. 3 and 4. Persons of skill in the art will appreciate that where the average thicknesses of layers 44-i and 30-2-i are of the order of a fraction to several times the diameter of an atom or alloy molecule, that it may not be possible to resolve the individual DLs making up stack 46' and that stack 46' may appear to be a substantially homogeneous mixture of FM and N-FM materials, with properties similar to those provided by co-deposited alloy layer 46 of FIG. 4.

FIG. 6 is a cross section of portion 11-5 of MTJ 10 of FIG. 1 embodying free SAF layer 14-5, according to a yet further embodiment of the invention and showing additional detail. Free SAF layer 14-5 differs from previous embodiments in that $2^{nd}$ IL 47 containing a N-FM material, such as for example Ta, is provided between FM IL 41 (e.g. of CoFe) and FM layer 30 or 30-1(e.g., of NiFe). Layer 47 may comprise dusting layer 44 of FIG. 3 or alloyed FM & N-FM layer 46 of FIG. 4 or layered FM & N-FM stack 46' of FIG. 5, or a combination thereof. What is important is that $2^{nd}$ IL 47 includes a N-FM component, such as for example, Ta or one or more of the equivalent materials described earlier. Free SAF layer 14-5 also desirably includes $3^{rd}$ FM & N-FM IL layer 48 between top electrode 12 and FM (e.g., NiFe) layer 26. The composition of layer 48 may comprise any of the materials useful for layer 47 and may be of the same or different composition than layer 47.

FIG. 7 is a cross section of portion 11-6 of MTJ 10 of FIG. 1 embodying free SAF layer 14-6, according to a yet still further embodiment of the invention and showing additional detail. In free SAF layer 14-6 of FIG. 7, N-FM IL layer 40 (e.g., comprising Ta) of FIG. 2 is retained between coupling (e.g. Ru) layer 38 and FM IL 41(e.g., of CoFe), and $2^{nd}$ IL 47 is provided between FM IL 41(e.g., of CoFe) and FM layer 30 or 30-1 (e.g., of NiFe). Insertion layer 47 may comprise any of the materials discussed above in connection with FIG. 6.

FIG. 8 is a cross section of portion 11-7 of MTJ 10 of FIG. 1 embodying free SAF layer 14-7, according to a still yet further embodiment of the invention and showing additional detail. Free SAF layer 14-7 of FIG. 8 is similar to free SAF layer 14-6 of FIG. 7 except that $3^{rd}$ IL 48 (e.g., containing Ta) is included between top electrode 12 and FM layer 26. As noted in connection with FIG. 6, layer 48 may comprise any or all of the material making up layer 47 and may be the same or different than layer 47.

It is desirable that Ta containing layers 44, 46, 46', 47 not be too close to tunnel barrier 16; stated another way, that dimension 31 of FM material 30 or 30-1 (see FIGS. 3-8) not be too thin. Dimension 31 is usefully at least 20 Angstroms and more conveniently in the range of about 20 to 60 Angstroms and preferably about 30 to 45 Angstroms. If dimension 31 is significantly less than about 20 Angstroms, then the MR ratio can decrease with increasing N-FM (e.g., Ta) thickness or content in layers 44, 46, 46', 47 due to reduced spin polarization of layer 30 or 30-1. For dimension 31 greater than about 20 Angstroms, the MR ratio increases with increasing N-FM (e.g., Ta) thickness or content in layer 44, 46, 46', 47. For example, for the structure of FIGS. 3 with FM layer 30-1 having thickness 31 of about 31 Angstroms, and with FM layer 30-2 of average thickness of about 10 Angstroms, the MR linearly increases with the thickness of Ta layer 44, by about 1.67% per Angstrom of average Ta layer thickness up to about 3 Angstroms. For Ta layer 44 of average thickness of about 3 Angstroms, the MR ratio exceeds 50 percent, which is a very significant improvement over prior art MR ratio of about 45% without Ta dusting layer 44. It was found that when the structure of FIG. 7 was implemented using multiple combinations of Ta dusting layer 44 and FM layer 30-2 according to the teachings of FIG. 5, to form $2^{nd}$ IL 47 in FIG. 7, even larger values of MR ratio are obtained. For example, MR ratios greater than 55% were obtained for a structure having FM layer 30 of NiFe (next to tunnel barrier 16) of about 31 Angstroms, four repetitions of double layer DLi (with i=1, 2, 3, 4) comprising Ta—NiFe insertion layers 44-i, 30-2-i (with i=1, 2, 3, 4) where each combination layer had Ta layer 44-i of about 0.6 Angstroms average thickness and NiFe layer 30-2-i of about 6.3 Angstroms average thickness, FM insertion layer (e.g., CoFe) 41 of about 2.5 Angstroms average thickness, N-FM insertion layer (e.g., Ta) 40 of about 1.3

Angstroms average thickness, N-FM coupling layer (e.g., Ru) 38 of about 5.5 Angstroms average thickness and FM layer 26 of NiFe (next to top electrode 12) of about 50 Angstroms average thickness. This is a very significant improvement in MR ratio and leads to improved MTJs, and hence to MRAMs and other MTJ-based devices, having higher speed, larger temperature tolerance, and reduced yield losses from MR ratio variations across the wafer. The increase in MR ratio obtained through this invention is believed to arise from an improved sharpness of the interfaces between the tunnel barrier and the adjacent ferromagnetic layers. The improved sharpness arises from changes in the way atoms diffuse in the materials during deposition and during subsequent heat treatments. The insertion layers may block the diffusion of certain elements and may change the chemical driving forces for diffusion to make sharp interfaces more thermodynamically favorable. Other materials having chemical properties similar to Ta, such as but not limited to Zr, Hf, Mg, Ti, V, Zn, Nb, and Cr, are expected to have a similar impact on MR. However, too much Ta thickness or content in layer 44, 46, 46', or 47 can lead to a very low magnetic moment or yield a non-magnetic layer, and cause low Hsat or undesirable decoupling of the ferromagnetic materials adjacent to the insertion layer. Thus, the ranges of thickness, materials and layers described herein provide improved MR, and also high enough coupling between ferromagnetic layers separated by the coupling layer.

It is also desirable to increase the MR ratio by optimizing the fixed or pinned SAF layers for MTJs and other magnetic devices that employ fixed or pinned SAF layers, as for example and not limited to MRAMs, magnetic sensors and read heads in hard disk drives. FIGS. 9-10 illustrate how this can be accomplished according to further embodiments of the invention. FIG. 9 is a cross section of portion 13-1 of the MTJ of FIG. 1 embodying pinned or fixed SAF layer 18-1, according to an additional embodiment of the invention and showing further detail. Pinned SAF layer 18-1 comprises FM layer 50, e.g. of CoFeB, having average thickness 51, immediately below tunnel barrier 16, N-FM insertion layer (IL) 52 below FM layer 50, e.g. of Ta or equivalent N-FM material as previously discussed, FM insertion layer (IL) 54 below layer 52, e.g. of CoFeB and having average thickness 55, coupling layer 56, e.g. of Ru, below layer 54, FM layer 58, e.g. of CoFe, below layer 56, pinning layer 20, e.g. of PtMn, below layer 58, seed layer 22, e.g. of Ta, TaN and/or Al/Ru, below layer 20 and base electrode 24 (e.g. of TaN or Ta) below seed layer 22. Suitable choices of materials for pinning layer 20, seed layer 22 and base electrode 24 are well known in the art. Layers 50, 54, 58 are pinned or fixed, that is, their magnetic moment is substantially unaffected by the magnetic fields used to alter the orientation of the magnetic moment vectors of free SAF layers 14 in portion 11 of MTJ device 10. N-FM IL 52 is desirably a Ta dusting layer analogous to layer 44 of FIG. 3. The MR ratio of SAF 18-1 can be increased by using N-FM insertion layer (IL) 52, analogous to dusting layer 44 of FIG. 3 for example of Ta, sandwiched between FM layers 50 and 54, for example of CoFeB. While Ta and CoFeB are preferred materials, other materials may also be used for layer 52 and layers 50, 54, for example, Hf, Zr, Ti, Mg, Nb, V, Zn and Cr and combinations thereof can be used in place of Ta in layer 52, and CoFe, CoFeX (where X indicates a non-magnetic material), Fe and other alloys containing Fe or Co can be used in place of CoFeB in one or both of layers 50, 54. In order to obtain both higher MR and adequate $H_{sat}$, it is desirable that distance 51 separating N-FM insertion layer 52 from tunnel barrier 16 be larger than a predetermined amount, such as is noted for thickness or distance 31 in connection with the discussion of layers 44 and 16 for free SAF layers 14, which discussion is incorporated herein by reference. Also, it is desirable that thickness or distance 55 separating N-FM insertion layer (IL) 52 from coupling layer 56 also exceed another predetermined distance. In general distance 55 should be equal or larger than about half of distance 51. Larger or smaller distances may be useful depending upon the choice of materials for N-FM insertion layer (IL) 52 and FM layers 50, 54. Significant improvement in the MR ratio is obtained. For example, where FM layers 50, 54 are of CoFeB and of average thickness of about 19 Angstroms and 10 Angstroms respectively and N-FM insertion layer (IL) 52 is of Ta with an average thickness of about 0.6 to 1.0 Angstroms, the MR ratio increased by about 7.2% compared to a substantially identical structure without N-FM IL 52, (i.e., Ta thickness=0). This is a significant improvement in MR ratio and can provide improved device performance and manufacturing yield. Further, N-FM IL 52 can be replaced by a Ta containing magnetic or non-magnetic alloyed layer or a stack of Ta-FM double layers similar to layer 46, 46' and 47 as shown in FIGS. 4-8. Additionally, Ta can be replaced by Hf, Zr, Ti, Mg, Nb, V, Zn, Cr and/or combinations thereof.

FIG. 10 is a cross section of portion 13-2 of MTJ 10 of FIG. 1 embodying pinned or fixed SAF layer 18-2, according to a yet additional embodiment of the invention and showing further detail. Pinned SAF layer 18-2 comprises FM layer 60 immediately below tunnel barrier 16, for example of CoFe and having thickness 61, FM & N-FM insertion layer (IL) 62 below FM layer 60, for example of CoFeBTa, coupling layer 66 below layer 62, for example of Ru analogous to layer 56 of FIG. 9, FM layer 68 below layer 66, for example of CoFe analogous to layer 58 of FIG. 9, and pinning layer 20, seed layer 22 and base electrode 24 in that order analogous to similarly identified layers in FIG. 9. FM & N-FM insertion layer (IL) 62 may be formed by any convenient technique, of which co-deposition or layered sequential deposition of the FM and N-FM materials are non-limiting examples. It is desirable that thickness of distance 61 separating IL 62 from tunnel barrier 16 exceed a pre-determined amount, as has been previously described analogously in connection with layers 44, 46, 46', 47 of free SAF layers 14 and also with layer 52 of pinned SAF layer 18-1, which discussion and dimensions are incorporated herein by reference. In a preferred embodiment, insertion layer (IL) 62 comprises Co (~40 to 70%) Fe (~5 to 25%) B (~5 to 30%) and Ta (~2 to 25%), but larger or smaller amounts of Ta or equivalent material can also be used. Non-limiting examples of alternative material instead of Ta are Hf, Zr, Ti, Mg, Nb, V, Zn, Cr and combination thereof. Other useful combinations instead of CoFeB are CoFe, Co-based alloys, Fe-based alloys, and other CoFeX alloys (where X represents a non-magnetic material). Significant improvement in MR ratio is provided by the structure of FIG. 10. For example and not intended to be limiting, a series of MTJ devices having pinned SAF layer 18-2 corresponding to that of FIG. 10 but without CoFeBTa insertion layer (IL) 62 gave an average MR value of about 47.3%, while substantially the same structure with IL 62 present gave an average MR ratio of about 50%, which is an average improvement of about a 6% while also yielding high enough values of $H_{sat}$. This is a significant change, leading to improved device performance and improved performance dependent manufacturing yield.

According to a first embodiment of the invention, there is provided a magnetic tunnel junction device (10), comprising, a synthetic antiferromagnet (SAF) structure (14, 18) having at least first (41, 30, 30-2, 30-1; 50, 54) and second (26, 58) ferromagnetic (FM) layers separated by a coupling layer (38, 56), wherein the first (41, 30, 30-2, 30-1; 50, 54) FM layer has first (41, 30-2, 54) and second (30, 30-1, 50) portions, a further layer (44, 46, 46' 47) containing Ta, Zr, Hf, Ti, Mg, Nb, V, Zn, Cr or a combination thereof, spaced apart from the coupling layer (38, 56) by at least the first portion (30-2, 41, 30-2-*i*, 54) of the first FM layer (41, 30, 30-2, 30-1; 50, 54), and a dielectric tunnel barrier (16) proximate the second portion (30-1, 30, 50) of the first FM layer (41, 30, 30-2, 30-1; 50, 54). According to a further embodiment, the dielectric tunnel barrier (16) contacts the second portion (30-1, 30, 50) of the first FM layer (41, 30, 30-2, 30-1; 50, 54). According to a still further embodiment, the device further comprises a top electrode (12) and wherein the SAF structure (14, 18) is a free SAF structure (14) and the second (26) FM layer abuts the top electrode (12). According to a yet further embodiment, the device further comprises a still further layer (48) containing one or more of Ta, Zr, Hf, Ti, Mg, Nb, V, Zn, Cr or a combination thereof, located between the second (26) FM layer and the top electrode (12). According to a yet still further embodiment, the further layer (44, 46, 46' 47) comprises a dusting layer (44) of one or more of Ta, Zr, Hf, Ti, Mg, Nb, V, Zn, Cr or a combination thereof, covered by the first portion (41, 30-2, 54) of the first FM layer (41, 30, 30-2, 30-1, 50, 54). According to a still yet further embodiment, the further layer (44, 46, 46' 47) comprises an alloyed layer (46) containing FM material and containing N-FM material comprising Ta, Zr, Hf, Ti, Mg, Nb, V, Zn, Cr or a combination thereof. According to an additional embodiment, the further layer (44, 46, 46' 47) comprises a stack of double layers (46') having sequential layers (30-2-*i*) of FM material interleaved with layers (44-*i*) of N-FM material comprising Ta, Zr, Hf, Ti, Mg, Nb, V, Zn, Cr or a combination thereof. According to a still additional embodiment, at least one of (i) the first portion (41, 30-2, 54) of the first FM layer (41, 30, 30-2, 30-1; 50, 54) and (ii) the second portion of the first FM layer comprises one or more of CoFe, NiFe, NiFeCo, or CoFeX where X is a N-FM material. According to a yet additional embodiment, X comprises boron (B). According to an additional embodiment, the SAF structure (14, 18) is a free SAF structure (14) and the further layer (44, 46, 46' 47) is located at least 20 Angstroms from the tunnel barrier (16). According to a still additional embodiment, the SAF structure (14, 18) is a pinned SAF structure (18) and the further layer (52) is located at least 5 Angstroms from the tunnel barrier (16).

According to a second embodiment, there is provided an electronic device (10), comprising, a top electrode (12), a tunnel barrier (16), a free synthetic anti-ferromagnetic (SAF) structure (14) located between the tunnel barrier (16) and the top electrode (12) and comprising, first (30, 30-1) and second (26) ferromagnetic (FM) layers, wherein the first FM layer (30, 30-1) overlies the tunnel barrier (16) and the second FM layer (26) underlies the top electrode (12), and a non-ferromagnetic (N-FM) coupling layer (38) comprising one or more of Ru, Re, Os, Ir, and Rh, located between the first (30, 30-1) and second (26) FM layers, a further layer (44, 46, 46', 47) containing a N-FM material different than the coupling layer (38) and located between the coupling layer (38) and the first FM layer (30, 30-1), and a still further layer (41) located between the coupling layer (38) and the further layer (44, 46, 46', 47). According to a further embodiment, the first FM layer (30, 30-1) separates the further layer (44, 46, 46', 47) from the tunnel barrier (16) by a distance of at least 20 Angstroms. According to a still further embodiment, the further layer (44, 46, 46', 47) comprises one or more of N-FM materials Ta, Zr, Hf, Ti, V, Nb, Mg, Zn, Cr or a combination thereof. According to a yet further embodiment, the further layer (44, 46, 46', 47) also comprises a FM material. According to a still yet further embodiment, the N-FM material and the FM material of the further layer (44, 46, 46', 47) are approximately in the ratio of about 5-25% N-FM to about 75-95% FM material. According to a yet still further embodiment, the N-FM material of the further layer comprises Ta.

According to a third embodiment, there is provided an electronic device (10) incorporating a pinned synthetic anti-ferromagnetic (SAF) structure (18), comprising, a pinning layer (20), a tunnel barrier (16), a pinned synthetic anti-ferromagnetic (SAF) structure (18) between the tunnel barrier (16) and the pinning layer (20) and comprising, first (50, 60) and second (58, 68) ferromagnetic (FM) layers, wherein the first FM layer (50, 60) underlies the tunnel barrier (16) and the second FM layer (58, 68) overlies the pinning layer (20), a non-ferromagnetic (N-FM) coupling layer (56, 66) comprising one or more of Ru, Re, Os, Ir, and Rh, located between the first (50, 60) and second (58, 68) FM layers, and a further layer (52, 62) containing a N-FM material different than the coupling layer (56, 66) and located between the coupling layer (56, 66) and the first FM layer (50, 60). According to a further embodiment, the device further comprises an additional FM layer (54) located between the coupling layer (56) and the further layer (52). According to a still further embodiment, the further layer (62) comprises a FM material and a N-FM material, wherein the N-FM material comprises one or more of Ta, Zr, Hf, Ti, V, Nb, Mg, Zn, Cr or a combination thereof. According to a yet further embodiment, the further layer comprises one or more of Ta, Zr, Hf, Ti, V, Nb, Mg, Zn, Cr or a combination thereof. According to a still yet further embodiment, the first FM layer (50, 60) separates the further layer (52, 62) from the tunnel barrier (16) by a distance of at least 5 Angstroms. According to a yet still further embodiment, the N-FM material and the FM material of the further layer (52, 62) are approximately in the ratio of about 5-25% N-FM to about 75-95% FM material.

While at least one exemplary embodiment has been presented in the foregoing detailed description, it should be appreciated that a vast number of variations exist, especially with respect to choice and arrangement of materials making up SAF layers 14 and 18. It should also be appreciated that the exemplary embodiment are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A magnetic tunnel junction device, comprising:
    a synthetic antiferromagnet (SAF) structure having at least first and second ferromagnetic (FM) layers separated by a coupling layer, wherein the first FM layer has first and second portions;
    a further FM layer containing Ta, Zr, Hf, Ti, Mg, Nb, V, Zn, Cr or a combination thereof and a FM material as an alloy, spaced apart from the coupling layer by at least the first portion of the first FM layer and
    a dielectric tunnel barrier proximate the second portion of the first FM layer.

2. The device of claim 1, wherein the dielectric tunnel barrier contacts the second portion of the first FM layer.

3. The device of claim 1, further comprising a top electrode and wherein the SAF structure is a free SAF structure and the second FM layer abuts the top electrode.

4. The device of claim 3, further comprising a still further layer containing one or more of Ta, Zr, Hf, Ti, Mg, Nb, V, Zn, Cr or a combination thereof, located between the second FM layer and the top electrode.

5. The device of claim 1, wherein the further FM layer comprises a stack of double layers having sequential layers of FM material interleaved with layers of N-FM material comprising Ta, Zr, Hf, Ti, Mg, Nb, V, Zn, Cr or a combination thereof.

6. The device of claim 1, wherein at least one of (i) the first portion of the first FM layer and (ii) the second portion of the first FM layer comprises one or more of CoFe, NiFe, NiFeCo, or CoFeX where X is a N-FM material.

7. The device of claim 6, wherein X comprises boron.

8. The device of claim 1, wherein the SAF structure is a free SAF structure and the further FM layer is located at least 20 Angstroms from the tunnel barrier.

9. The device of claim 1, wherein the SAF structure is a pinned SAF structure and the further FM layer is located at least 5 Angstroms from the tunnel barrier.

10. An electronic device, comprising:
a top electrode;
a tunnel barrier;
a free synthetic anti-ferromagnetic (SAF) structure located between the tunnel barrier and the top electrode and comprising:
first and second ferromagnetic (FM) layers, wherein the first FM layer overlies the tunnel barrier and the second FM layer underlies the top electrode;
a non-ferromagnetic (N-FM) coupling layer comprising one or more of Ru, Re, Os, Ir, and Rh, located between the first and second FM layers;
a further FM layer containing a N-FM material and a FM material as an alloy located between the coupling layer and the first FM layer, the N-FM material consisting of at least one of the materials selected from Ta, Zr, Hf, Ti, V, Nb, Mg, Zn, and Cr; and
a still further FM layer located between the coupling layer and the further FM layer.

11. The device of claim 10, wherein the first FM layer separates the further FM layer from the tunnel barrier by a distance of at least 20 Angstroms.

12. The device of claim 10, wherein the N-FM material and the FM material of the further FM layer are approximately in the ratio of about 5-25% N-FM to about 75-95% FM material.

13. The electronic device of claim 10 wherein the further FM layer comprises alternating layers of FM and N-FM material, the N-FM material layers being of thickness 3 Angstroms or less.

14. The electronic device of claim 10 further comprising an additional layer containing N-FM material between the top electrode and the second FM layer.

15. The electronic device of claim 10 further comprising a N-FM layer between the non-ferromagnetic (N-FM) coupling layer and the still further FM layer.

16. The device of claim 10, wherein the further FM layer contains an amount of N-FM material corresponding to 3 bulk Angstroms or less.

17. An electronic device incorporating a pinned synthetic anti-ferromagnetic (SAF) structure, comprising:
a pinning layer;
a tunnel barrier;
a pinned synthetic anti-ferromagnetic (SAF) structure between the tunnel barrier and the pinning layer and comprising:
first and second ferromagnetic (FM) layers, wherein the first FM layer underlies the tunnel barrier and the second FM layer overlies the pinning layer;
a non-ferromagnetic (N-FM) coupling layer comprising one or more of Ru, Re, Os, Ir, and Rh, located between the first and second FM layers;
a further FM layer containing a N-FM material and a FM material as an alloy located between the coupling layer and the first FM layer, the N-FM material consisting of at least one of the materials selected from Ta, Zr, Hf, Ti, V, Nb, Mg, Zn, and Cr; and
an additional FM layer located between the coupling layer and the further FM layer.

18. The device of claim 17, wherein the first FM layer separates the further FM layer from the tunnel barrier by a distance of at least 5 Angstroms.

19. The device of claim 17, wherein the N-FM material and the FM material of the further FM layer are approximately in the ratio of about 5-25% N-FM to about 75-95% FM material.

20. The electronic device of claim 17 further comprising a N-FM layer between the non-ferromagnetic (N-FM) coupling layer and the additional FM layer.

21. The device of claim 17, wherein the further FM layer contains an amount of N-FM material corresponding to 3 bulk Angstroms or less.

* * * * *